(12) United States Patent
Ge

(10) Patent No.: US 11,644,502 B2
(45) Date of Patent: May 9, 2023

(54) CIRCUIT AND METHOD FOR REDUCING INTERFERENCE OF POWER ON/OFF TO HARDWARE TEST

(71) Applicant: ZHENGZHOU YUNHAI INFORMATION TECHNOLOGY CO., LTD., Henan (CN)

(72) Inventor: Zhihua Ge, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 116 days.

(21) Appl. No.: 17/271,219

(22) PCT Filed: Jun. 27, 2019

(86) PCT No.: PCT/CN2019/093324
§ 371 (c)(1),
(2) Date: Feb. 25, 2021

(87) PCT Pub. No.: WO2020/042740
PCT Pub. Date: Mar. 5, 2020

(65) Prior Publication Data
US 2021/0247444 A1 Aug. 12, 2021

(30) Foreign Application Priority Data
Aug. 27, 2018 (CN) .......................... 201810982949.4

(51) Int. Cl.
*G01R 31/317* (2006.01)
*G01R 31/00* (2006.01)
(Continued)

(52) U.S. Cl.
CPC ..... *G01R 31/31721* (2013.01); *G01R 31/001* (2013.01); *G01R 31/2844* (2013.01); *G01R 31/31725* (2013.01); *G01R 31/31905* (2013.01)

(58) Field of Classification Search
CPC .............. H02J 2310/52; H02J 2310/60; H02J 2300/26; H02J 3/00; H02J 2300/00;
(Continued)

(56) References Cited

U.S. PATENT DOCUMENTS 7,884,557 B2 * 2/2011 Steele .................... H05B 45/20
315/306
8,513,831 B2 * 8/2013 Bushue .................. H02J 1/102
307/43
(Continued)

FOREIGN PATENT DOCUMENTS

CN 103053003 A 4/2013
CN 103701163 A 4/2014
(Continued)

OTHER PUBLICATIONS

International Search Report for PCT/CN2019/093324 dated Oct. 9, 2019, ISA/CN.

*Primary Examiner* — Vinh P Nguyen
(74) *Attorney, Agent, or Firm* — Yue (Robert) Xu; Apex Attorneys at Law, LLP

(57) ABSTRACT

A circuit and a method for reducing interference of power on/off to hardware test. The circuit includes: a power unit, a voltage processing unit, a PSU and a to-be-tested hardware. An input terminal of the voltage processing unit is connected to the power unit, an output terminal of the voltage processing unit is connected to an input terminal of the PSU, and an output terminal of the PSU is connected to the to-be-tested hardware; the power unit is configured to provide an operating voltage; the voltage processing unit is configured to
(Continued)

eliminate electric sparks caused by instability of the operating voltage at an instant of power on/off; the PSU is configured to convert a stable operating voltage outputted from the voltage processing unit into a direct current voltage required for the to-be-tested hardware; and the to-be-tested hardware is configured to receive the direct current voltage outputted from the PSU.

10 Claims, 3 Drawing Sheets

(51) Int. Cl.
 *G01R 31/28* (2006.01)
 *G01R 31/319* (2006.01)
(58) Field of Classification Search
 CPC .......... H02J 7/00302; H02J 3/38; H02J 3/007; H02J 7/0068; H02J 7/0029; G01R 31/001; G01R 13/0254; G01R 31/31721; G01R 31/31905; G01R 19/145; G01R 1/30; G01R 31/2844; G01R 31/31725; H02H 3/16; H02H 7/20; H01R 25/147; H01R 13/6205
 See application file for complete search history.

(56) References Cited

U.S. PATENT DOCUMENTS

| | | | |
|---|---|---|---|
| 9,240,290 B2* | 1/2016 | Kim | H01H 7/00 |
| 9,419,434 B2* | 8/2016 | Eguchi | G06F 1/26 |
| 10,700,603 B2* | 6/2020 | Flipo | H02M 3/156 |
| 2013/0126320 A1 | 5/2013 | Kim | |

FOREIGN PATENT DOCUMENTS

| | | |
|---|---|---|
| CN | 206281909 U | 6/2017 |
| CN | 109142821 A | 1/2019 |
| CN | 208780742 U | 4/2019 |
| KR | 20090109936 A | 10/2009 |
| TW | 201131924 A | 9/2011 |
| WO | 2015081636 A1 | 6/2015 |

* cited by examiner

US 11,644,502 B2

1

CIRCUIT AND METHOD FOR REDUCING INTERFERENCE OF POWER ON/OFF TO HARDWARE TEST

This application is the national phase of International Application No. PCT/CN2019/093324, titled "CIRCUIT AND METHOD FOR REDUCING INTERFERENCE OF POWER ON/OFF TO HARDWARE TEST", filed on Jun. 27, 2019, which claims the priority to Chinese Patent Application No. 201810982949.4, titled "CIRCUIT AND METHOD FOR REDUCING INTERFERENCE OF POWER ON/OFF TO HARDWARE TEST", filed on Aug. 27, 2018 with the China National Intellectual Property Administration (CNIPA), which is incorporated herein by reference in its entirety.

FIELD

The present disclosure relates to the field of hardware test for a server, particularly to a circuit for reducing interference of power on/off to hardware test.

BACKGROUND

In order to ensure a long-term stable operation of each board of a server and reduce any potential problem caused by undesired signal quality of hardware, it is necessary to use an oscilloscope to conduct a comprehensive test after the board is recovered. When testing a board of the server, each board of the server is necessary to be initialized at the beginning of power-on. If the board is initialized as pre-designed, it may be ensured for a normal operation of the board in the future. In general, steps for testing a board are as follows. First, connect a probe of an oscilloscope to a testing point and set the oscilloscope to be in an edge-triggered mode. Then, power on the board, so that the oscilloscope automatically captures hopping waveforms of a tested signal, and the waveforms are analyzed and saved by a test engineer. Finally, power off the board. However, in practice, when powering on the board, a mechanical switch is used to switch the power supply to the board, and at this time, the board is already connected to the circuit as a load. In a critical state of the mechanical switch being from off to on, it is easy to generate electric sparks. The board has not been stably powered on in the critical state, but the interference due to the electric sparks may cause undesired triggering of the oscilloscope. In this case, the oscilloscope captures interference signals of the electric sparks generated when the board has not been stably powered on, rather than required signals during the initialization process after the board is stably powered on. Similarly, when powering off the board, a sudden disconnection of a big load will cause a pulse current and generate electric sparks. Interference due to the electric sparks may cause undesired triggering of the oscilloscope. The oscilloscope captures interference signals of the electric sparks when the board has not been stably powered off. Due to the interference of electric sparks, it is often necessary to repeat the test in order to capture and measure an effective hopping of a signal, which may waste lots of time and result in low test efficiency.

SUMMARY

To overcome the defects in the conventional technology, a circuit and a method for reducing interference of power

2 on/off to hardware test are proposed in the present disclosure, so as to effectively reduce interference of power on/off to hardware test.

A circuit for reducing interference of power on/off to hardware test includes: a power unit, a voltage processing unit, a PSU, and a to-be-tested hardware, in which, an input terminal of the voltage processing unit is connected to the power unit, an output terminal of the voltage processing unit is connected to an input terminal of the PSU, and an output terminal of the PSU is connected to the to-be-tested hardware;

the power unit is configured to provide an operating voltage;

the voltage processing unit is configured to eliminate electric sparks caused by instability of the operating voltage at an instant of power on/off;

the PSU is configured to convert a stable operating voltage outputted from the voltage processing unit into a direct current voltage required for the to-be-tested hardware; and the to-be-tested hardware is configured to receive the direct current voltage outputted from the PSU.

In an embodiment, the power unit is configured to provide an alternating current voltage of 220V.

In an embodiment, the voltage processing unit includes: a mechanical switch, an isolated power supply module 1, a first delay circuit, a MOSFET 1, an isolated power supply module 2, a second delay circuit and a MOSFET 2, in which, two terminals of the mechanical switch close to the power unit are connected to a neutral wire and a live wire of the power unit respectively, a neutral wire and a live wire at two terminals of the mechanical switch far away from the power unit are connected to two alternating current input terminals of the isolated power supply module 1 respectively, and the neutral wire and the live wire at the two terminals of the mechanical switch far away from the power unit are further connected to two alternating current input terminals of the isolated power supply module 2 respectively;

a positive pole of a direct current output terminal of the isolated power supply module 1 is connected to a first terminal of a resistor R1 in the first delay circuit;

a second terminal of the resistor R1 is connected to a first terminal of a first capacitor C1 and a gate of the N-channel MOSFET 1;

a second terminal of the first capacitor C1 is connected to a negative pole of the direct current output terminal of the isolated power supply module 1 and a source of the N-channel MOSFET 1;

the N-channel MOSFET 1 includes a parasitic diode D1, the parasitic diode D1 having an anode connected to the source of the MOSFET 1 and having a cathode connected to a drain of the MOSFET 1;

the drain of the MOSFET 1 is further connected to the live wire of the power unit;

a positive pole of a direct current output terminal of the isolated power supply module 2 is connected to a first terminal of a resistor R2 in the second delay circuit;

a second terminal of the resistor R2 is connected to a first terminal of a second capacitor C2 and a gate of the N-channel MOSFET 2;

a second terminal of the second capacitor C2 is connected to the negative pole of the direct current output terminal of the isolated power supply module 1, a source of the N-channel MOSFET 2, and the source of the N-channel MOSFET 1;

the N-channel MOSFET 2 includes a parasitic diode D2, the parasitic diode D2 having an anode connected to the source of the MOSFET 2 and having a cathode connected to a drain of the MOSFET 2;

the drain of the MOSFET 2 is further connected to the PSU; and the PSU is connected to the neutral wire of the power unit and the to-be-tested hardware.

In an embodiment, the first delay circuit includes the resistor R1 and the first capacitor C1; and the second delay circuit includes the resistor R2 and the second capacitor C2.

In an embodiment, AC and DC in the isolated power supply module 1 are electrically isolated from each other; and AC and DC in the isolated power supply module 2 are electrically isolated from each other.

In an embodiment, a circuit is from disconnection to connection when the mechanical switch is turned on, indicating that the circuit is powered on; and the circuit is from connection to disconnection when the mechanical switch is turned off, indicating that the circuit is powered off.

In an embodiment, the PSU is configured to convert the stable operating voltage outputted from the voltage processing unit into a direct current voltage of 12V.

A method for reducing interference of power on/off to hardware test, implemented based on a circuit for reducing interference of power on/off to hardware test, where the method includes:

S1, connecting the circuit for reducing interference of power on/off to hardware test;

S2, connecting an oscilloscope to a to-be-tested hardware and setting the oscilloscope to be in an edge-triggered mode;

S3, turning on a mechanical switch, to power on the to-be-tested hardware; and S4, capturing and saving waveforms by the oscilloscope.

In an embodiment, the method for reducing interference of power on/off to hardware test further includes: turning off the mechanical switch, to power off the to-be-tested hardware.

In an embodiment, the waveforms are effective waveforms required in a hardware testing process.

The effects described in the summary are merely effects of the embodiments, rather than all the effects of the present disclosure. One of the above technical solutions has the following advantages or beneficial effects.

In the circuit and the method for reducing interference of power on/off to hardware test according to the present disclosure, it retains the original function of the mechanical switch to control power-on and power-off, and is compatible with the original solution in operation. It only needs to add simple elements to the circuit, which has a simple structure and is easy to implement, without adding new operating methods, and can be directly imported into an existing test process. The isolated power supply module, the RC delay circuit, and the MOSFET in the circuit are in series-opposing connection. At the power-on moment when the switch is turned on, due to the RC delay circuit, the gate voltage of the MOSFET may slowly rise in a slope shape and the MOSFET is gradually turned on. At the power-off moment when the switch is turned off, due to the RC delay circuit, the gate voltage of the MOSFET may slowly drop in a slope shape, and the MOSFET is gradually turned off. Thus, the interference to hardware test due to electric sparks caused by a critical state of the mechanical switch when being turned on for power-on or being turned off for power-off is eliminated, and the oscilloscope will not capture electric spark signal generated when the board has not been stably powered on/off, thereby improving test efficiency.

DETAILED DESCRIPTION OF THE EMBODIMENTS

Figure 1:
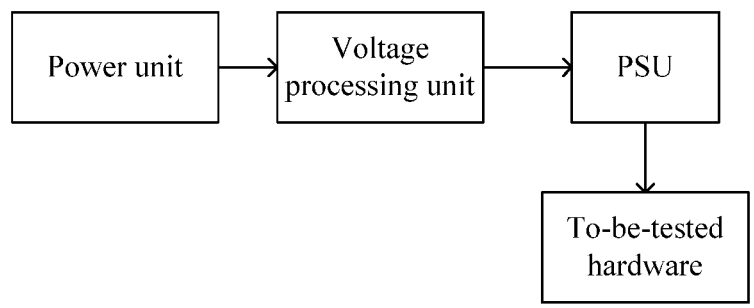
FIG. 1 is a schematic diagram showing a general principle of a circuit for reducing interference of power on/off to hardware test according to embodiment 1 of the present disclosure.

In order to clearly illustrate technical features of the present disclosure, the present disclosure are described in detail below in conjunction with embodiments and the drawings. The disclosure hereinafter provides multiple different embodiments or examples for implementing different structures of the present disclosure. To simplify the present disclosure, components and settings in specific embodiments are described below. In addition, reference numerals and/or letters may be used repeatedly in different embodiments of the present disclosure. Such repetition is for simplification and clarity, and does not indicate any relationship among various embodiments and/or settings discussed. It should be noted that the components shown in the drawings are not necessarily drawn to scale. Descriptions of well-known components, processing techniques and processes are omitted herein to avoid unnecessary limitation to the present disclosure.

Embodiment 1 of the present disclosure is described as follows.

FIG. 1 is a schematic diagram showing a general principle of a circuit for reducing interference of power on/off to hardware test according to embodiment 1 of the present disclosure. The circuit includes a power unit, a voltage processing unit, a PSU (power supply unit) and a to-be-tested hardware.

An input terminal of the voltage processing unit is connected to the power unit, an output terminal of the voltage processing unit is connected to an input terminal of the PSU, and an output terminal of the PSU is connected to the to-be-tested hardware.

The power unit is configured to provide an operating voltage. In the embodiment, the power unit is configured to provide an alternating current voltage of 220V. The voltage processing unit is configured to eliminate electric sparks caused by instability of the operating voltage at an instant of power on/off. The PSU is configured to convert a stable operating voltage outputted from the voltage processing unit into a direct current voltage required for the to-be-tested hardware. In the embodiment, the direct current voltage required for the to-be-tested hardware is 12V. The to-be-tested hardware is configured to receive the direct current voltage outputted from the PSU.

Figure 2:
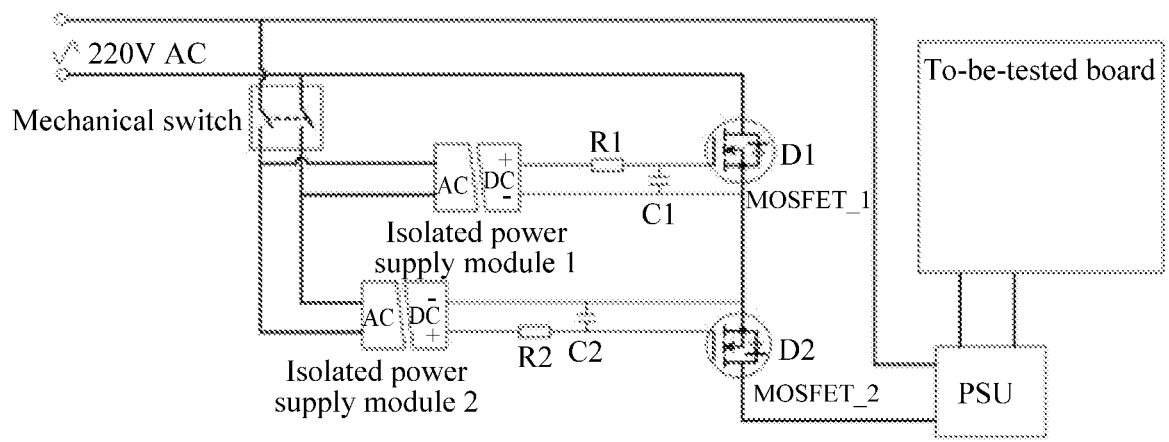
FIG. 2 is a circuit diagram of the circuit for reducing interference of power on/off to hardware test according to the embodiment 1 of the present disclosure.

FIG. 2 is a circuit diagram of the circuit for reducing interference of power on/off to hardware test according to the embodiment 1 of the present disclosure. Referring to FIG. 2, in the voltage processing unit, two terminals of a switch close to the power unit are connected to a neutral wire and a live wire of the power unit respectively, a neutral wire and a live wire at two terminals of the switch far away from the power unit are connected to alternating current input terminals of an isolated power supply module 1 respectively, and the neutral wire and the live wire at the two terminals of the switch far away from the power unit are further connected to two alternating current input terminals of an isolated power supply module 2 respectively. A positive pole of a direct current output terminal of the isolated power supply module 1 is connected to a first terminal of a resistor R1 in a first delay circuit; a second terminal of the resistor R1 is connected to a first terminal of a first capacitor C1 and a gate of a N-channel MOSFET (Metal-Oxide-Semiconductor Field-Effect Transistor) 1; a second terminal of the first capacitor C1 is connected to a negative pole of the direct current output terminal of the isolated power supply module 1 and a source of the N-channel MOSFET 1. The N-channel MOSFET 1 includes a parasitic diode D1, the parasitic diode D1 having an anode connected to the source of the MOSFET 1 and having a cathode connected to a drain of the MOSFET 1. The drain of the MOSFET 1 is further connected to the live wire of the power unit. A positive pole of a direct current output terminal of the isolated power supply module 2 is connected to a first terminal of a resistor R2 in a second delay circuit; a second terminal of the resistor R2 is connected to a first terminal of a second capacitor C2 and a gate of the N-channel MOSFET 2; a second terminal of the second capacitor C2 is connected to the negative pole of the direct current output terminal of the isolated power supply module 1, a source of the N-channel MOSFET 2, and the source of the N-channel MOSFET 1. The N-channel MOSFET 2 includes a parasitic diode D2, the parasitic diode D2 having an anode connected to the source of the MOSFET 2 and having a cathode connected to a drain of the MOSFET 2. The drain of the MOSFET 2 is further connected to the PSU; and the PSU is connected to the neutral wire of the power unit and the to-be-tested hardware.

In an embodiment, the first delay circuit includes the resistor R1 and the first capacitor C1, and the second delay circuit includes the resistor R2 and the second capacitor C2.

The principle of the voltage processing unit to reduce electric sparks at a power-on moment when the mechanical switch is turned on will be described as follows. When pressing the mechanical switch, the mechanical switch is stably turned on, the isolated power supply module 1 and the isolated power supply module 2 provide stable outputs. An output of the isolated power supply module 1 flows through the first delay circuit including the resister R1 and the first capacitor C1, to drive the MOSFET 1. At this time, a gate voltage of the MOSFET 1 gradually rises. When the gate voltage of the MOSFET 1 exceeds a turn-on voltage of the MOSFET 1, the MOSFET 1 is turned on, to generate a drain current I1. Similarly, when an output of the isolated power supply module 2 flows through the second delay circuit including the resister R2 and the second capacitor C2, to drive the MOSFET 2. At this time, a gate voltage of the MOSFET 2 gradually rises. When the gate voltage of the MOSFET 2 exceeds a turn-on voltage of the MOSFET 2, the MOSFET 2 is turned on, to generate a drain current I2.

In one cycle of alternating current, since a direction of the alternating current changes, it is assumed that the direction of the drain current I1 generated when the MOSFET 1 is turned on is a positive direction. Accordingly, in a sine wave cycle of the alternating current, I1 represents an upper half cycle of the sine wave. Then, the direction of the drain current I2 generated when the MOSFET 2 is a negative direction. In the sine wave cycle of the alternating current, I2 represents as a lower half cycle of the sine wave. There is a parasitic diode D2 inside the MOSFET 2, an anode of the diode D2 is connected to a source of the MOSFET 2 and a cathode of the diode D2 is connected to a drain of the MOSFET 2. Therefore, when the drain current I1 is flowing through the MOSFET 2, the voltage of the MOSFET 2 has no control function, so that the current I1 in the upper half cycle passes through the diode D2 and directly arrives at the PSU. Similarly, there is a parasitic diode D1 inside the MOSFET 1, an anode of the diode D1 is connected to a source of the MOSFET 1 and a cathode of the diode D1 is connected to a drain of the MOSFET 1. Therefore, when the drain current I2 is flowing through the MOSFET 1, the voltage of the MOSFET 1 has no control function, so that the current I2 in the upper half cycle passes through the diode D1 and directly arrives at the PSU.

As discussed above, the power-on of the isolated power supply module 1 and the isolated power supply module 2 at the back end are controlled by the mechanical switch, and the MOSFET 1 and the MOSFET 2 are used in series-opposing connection. Therefore, the to-be-tested board at the back end may be powered on only when both of the MOSFET 1 and the MOSFET 2 are turned on. An output of the isolated power supply module 1, passing through the first delay circuit including the resister R1 and the first capacitor C1, controls on-off of the MOSFET 1. That is, the MOSFET 1 may be turned on only when the output of the isolated power supply module 1 is stable and delayed for a time period. An output of the isolated power supply module 2, passing through the second delay circuit including the resister R2 and the first capacitor C2, controls on-off of the MOSFET 2. That is, the MOSFET 2 may be turned on only when the output of the isolated power supply module 2 is stable and delayed for a time period. When the mechanical switch is turned on, the isolated power supply module 1 and the isolated power supply module 2 are provided with a voltage of 220V. When the mechanical switch is in a critical state where mechanical contacts have not been stably got in touched, the isolated power supply module 1 and the isolated power supply module 2 cannot stably supply powers and thus there is no output. In this case, the MOSFET 1 and the MOSFET 2 are in a turn-off state. Once the mechanical switch is stably turned on, the isolated power supply module 1 and the isolated power supply module 2 can have stable outputs, and thus the MOSFET1 and the MOSFET2 are turned on, and the to-be-tested board is powered on. Due to the RC delay circuits, the gate voltages of the MOSFET 1 and the MOSFET 2 may slowly rise in a slope shape, and the MOSFET 1 and the MOSFET 2 will be gradually turned on. As a result, there will be no pulse current caused by a sudden turn-on of the mechanical switch, thereby reducing electromagnetic interference.

The principle of the voltage processing unit to reduce electric sparks at a power-off moment when the mechanical switch is turned off will be described as follows. When disconnecting the mechanical switch, the mechanical switch is stably turned off, and outputs of the isolated power supply module 1 and the isolated power supply module 2 are 0V. A discharging loop is formed by the first delay circuit and an internal circuit of the isolated power supply module 1. The first capacitor C1 discharges, and the gate voltage of the MOSFET 1 will slowly drop in a slope shape. When the gate voltage of the MOSFET 1 is lowered than a turn-on voltage of the MOSFET 1, the MOSFET 1 is turned off. Similarly, a discharging circuit is formed by the second delay circuit and an internal circuit of the isolated power supply module 2. The second capacitor C2 discharges, and the gate voltage of the MOSFET 2 will slowly drop in a slope shape. When the gate voltage of the MOSFET 2 is lower than a turn-on voltage of the MOSFET 2, the MOSFET2 is turned off. As a result, there will be no pulse current caused by a sudden turn-off of the mechanical switch, thereby reducing electromagnetic interference.

The PSU is configured to convert a stable operating voltage outputted from the voltage processing unit into a direct current voltage required for the to-be-tested hardware. In the embodiment 1, the direct current voltage required for the to-be-tested board is 12V. However, the present disclosure is not limited to the voltage value in this embodiment, and may also apply to other embodiments.

The to-be-tested hardware is configured to receive the direct current voltage outputted from the PSU. The oscilloscope may capture a waveform generated when the board is initially powered on, and may capture a waveform generated when the board is powered off.

Figure 3:
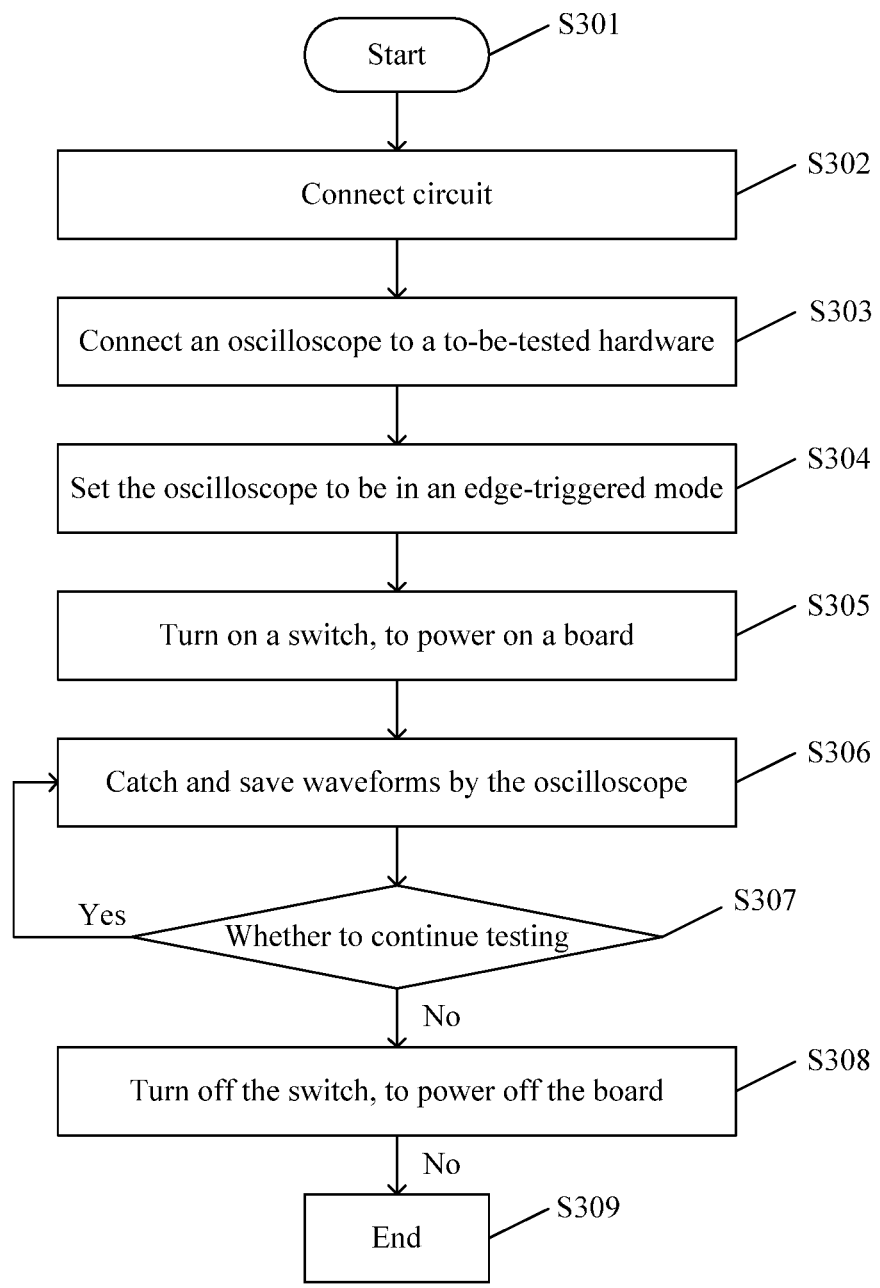
FIG. 3 is a flowchart of a method for reducing interference of power on/off to hardware test based on the embodiment 1 of the present disclosure.
Figure 4:
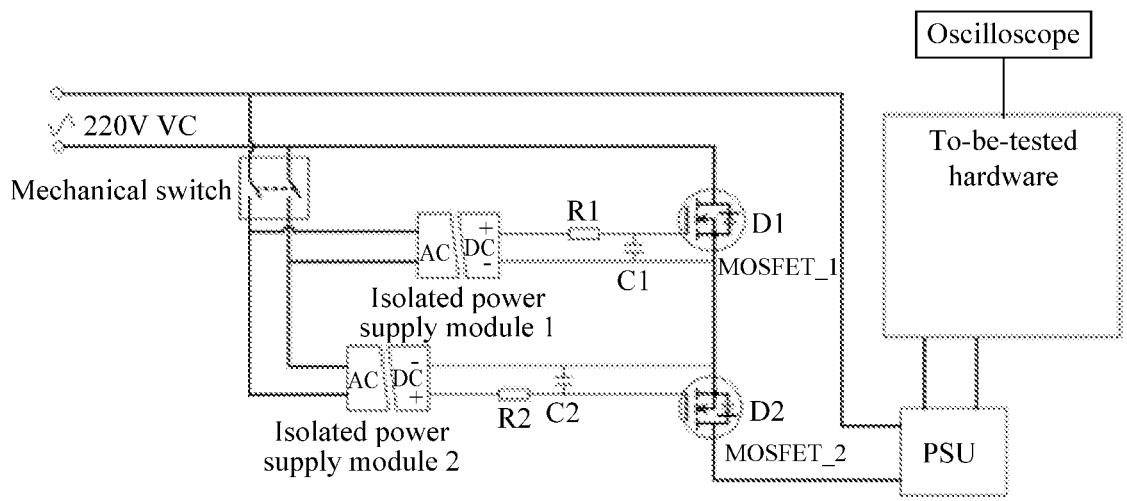
FIG. 4 shows a connection between an oscilloscope and the circuit for reducing interference of power on/off to hardware test according to the embodiment 1 of the present disclosure.

As shown in FIG. 3, a method for reducing interference of power on/off to hardware test based on the embodiment 1 of the present disclosure may include the following steps S301 to S309.

In step S301, start the process.

In step S302, a circuit is connected according to a circuit connection manner that reduces interference of power on/off to hardware test.

In step S303, an oscilloscope is connected to a to-be-tested hardware.

In step S304, the oscilloscope is set to be in an edge-triggered mode.

In step S305, the mechanical switch is turned on, to power on a board.

In step S306, waves are captured and saved by the oscilloscope.

In step S307, it is to determine whether it is required to continue testing. Proceed to step S306, if it is required to continue testing; proceed to step S308, if it is not required to continue testing.

In step S308, the mechanical switch is turned off, to power off the board.

In step S309, end the process.

Although the present disclosure is described in detail in the description with reference to drawings and the embodiments, it should be understood by those skilled in the art that, various modifications or equivalent replacements may be made to the present disclosure. Any technical solution and improvement without departing from the spirit and scope of the present disclosure should be deemed to be covered within the protection scope of the present disclosure.

The invention claimed is:

1. A circuit for reducing interference of power on/off to hardware test, comprising: a power unit, a voltage processing unit, a PSU and a to-be-tested hardware, wherein
an input terminal of the voltage processing unit is connected to the power unit, an output terminal of the voltage processing unit is connected to an input terminal of the PSU, and an output terminal of the PSU is connected to the to-be-tested hardware;
the power unit is configured to provide an operating voltage;
the voltage processing unit is configured to eliminate electric sparks caused by instability of the operating voltage at an instant of power on/off;
the PSU is configured to convert a stable operating voltage outputted from the voltage processing unit into a direct current voltage required for the to-be-tested hardware; and
the to-be-tested hardware is configured to receive the direct current voltage outputted from the PSU.

2. The circuit for reducing interference of power on/off to hardware test according to claim 1, wherein the power unit is configured to provide an alternating current voltage of 220V.

3. The circuit for reducing interference of power on/off to hardware test according to claim 1, wherein the voltage processing unit comprises a mechanical switch, a first isolated power supply module, a first delay circuit, a first MOSFET, a second isolated power supply module, a second delay circuit and a second MOSFET, wherein
two terminals of the mechanical switch close to the power unit are connected to a neutral wire and a live wire of the power unit respectively, a neutral wire and a live wire at two terminals of the mechanical switch far away from the power unit are connected to two alternating current input terminals of the first isolated power supply module respectively, and the neutral wire and the live wire at the two terminals of the mechanical switch far away from the power unit are further connected to two alternating current input terminals of the second isolated power supply module respectively;
a positive pole of a direct current output terminal of the first isolated power supply module is connected to a first terminal of a first resistor in the first delay circuit;
a second terminal of the first resistor is connected to a first terminal of a first capacitor and a gate of the first N-channel MOSFET;
a second terminal of the first capacitor is connected to a negative pole of the direct current output terminal of the first isolated power supply module and a source of the first N-channel MOSFET;
the first N-channel MOSFET comprises a first parasitic diode, the first parasitic diode having an anode connected to the source of the first MOSFET and having a cathode connected to a drain of the first MOSFET;
the drain of the first MOSFET is further connected to the live wire of the power unit;
a positive pole of a direct current output terminal of the second isolated power supply module is connected to a first terminal of a second resistor in the second delay circuit;
a second terminal of the second resistor is connected to a first terminal of a second capacitor and a gate of the second N-channel MOSFET;
a second terminal of the second capacitor is connected to a negative pole of the direct current output terminal of the second isolated power supply module, a source of the second N-channel MOSFET, and the source of the first N-channel MOSFET;
the second N-channel MOSFET comprises a second parasitic diode, the second parasitic diode having an anode connected to the source of the second MOSFET and having a cathode connected to a drain of the second MOSFET;
the drain of the second MOSFET is further connected to the PSU; and
the PSU is connected to the neutral wire of the power unit and the to-be-tested hardware.

4. The circuit for reducing interference of power on/off to hardware test according to claim 3, wherein the first delay circuit comprises the first resistor and the first capacitor; and the second delay circuit comprises the second resistor and the second capacitor.

5. The circuit for reducing interference of power on/off to hardware test according to claim 3, wherein AC and DC in the first isolated power supply module are electrically isolated from each other; and AC and DC in the second isolated power supply module are electrically isolated from each other.

6. The circuit for reducing interference of power on/off to hardware test according to claim 3, wherein the circuit for reducing interference of power on/off to hardware test is from disconnection to connection when the mechanical switch is turned on, indicating that the circuit for reducing interference of power on/off to hardware test is powered on; and the circuit for reducing interference of power on/off to hardware test for reducing interference of power on/off to hardware test is from connection to disconnection when the mechanical switch is turned off, indicating that the circuit for reducing interference of power on/off to hardware test is powered off.

7. A method for reducing interference of power on/off to hardware test, wherein the method is implemented based on the circuit for reducing interference of power on/off to hardware test according to claim 3, wherein the method comprises:
S1, connecting the circuit for reducing interference of power on/off to hardware test;
S2, connecting an oscilloscope to the to-be-tested hardware and setting the oscilloscope to be in an edge-triggered mode;
S3, turning on the mechanical switch, to power on the to-be-tested hardware; and
S4, capturing and saving waveforms by the oscilloscope.

8. The method for reducing interference of power on/off to hardware test according to claim 7, further comprising: turning off the mechanical switch, to power off the to-be-tested hardware.

9. The method for reducing interference of power on/off to hardware test according to claim 7, wherein the waveforms are effective waveforms required in a hardware testing process.

10. The circuit for reducing interference of power on/off to hardware test according to claim 1, wherein the PSU is configured to convert the stable operating voltage outputted from the voltage processing unit into a direct current voltage of 12V.

* * * * *